United States Patent
Cois et al.

(10) Patent No.: US 10,067,193 B2
(45) Date of Patent: Sep. 4, 2018

(54) METHOD AND APPARATUS FOR DETERMINING A CONSTANT CURRENT LIMIT VALUE

(71) Applicant: Robert Bosch GmbH, Stuttgart (DE)

(72) Inventors: Olivier Cois, Kernen (DE); Triantafyllos Zafiridis, Heilbronn (DE)

(73) Assignee: Robert Bosch GmbH, Stuttgart (DE)

( * ) Notice: Subject to any disclaimer, the term of this patent is extended or adjusted under 35 U.S.C. 154(b) by 94 days.

(21) Appl. No.: 15/219,996

(22) Filed: Jul. 26, 2016

(65) Prior Publication Data

US 2017/0030973 A1 Feb. 2, 2017

(30) Foreign Application Priority Data

Jul. 27, 2015 (DE) .................. 10 2015 214 130

(51) Int. Cl.
*G01R 31/36* (2006.01)
*G01R 19/165* (2006.01)
*H01M 10/42* (2006.01)

(52) U.S. Cl.
CPC ... *G01R 31/3627* (2013.01); *G01R 19/16542* (2013.01); *G01R 31/3624* (2013.01); *G01R 31/3651* (2013.01); *G01R 31/3662* (2013.01); *H01M 10/42* (2013.01)

(58) Field of Classification Search
CPC .......... G01R 31/3627; G01R 19/16542; G01R 31/3624; G01R 31/3651; G01R 31/3662; H01M 10/42
See application file for complete search history.

(56) References Cited

U.S. PATENT DOCUMENTS

| 2003/0001581 A1 | 1/2003 | Laig-Horstebrock et al. |
| 2011/0175577 A1* | 7/2011 | Kitanaka ............... H02J 7/0021 320/163 |
| 2015/0094971 A1* | 4/2015 | Boehm .............. G01R 31/3651 702/63 |
| 2016/0144736 A1* | 5/2016 | Trinkert ............. G01R 31/3606 702/63 |
| 2016/0190831 A1* | 6/2016 | Mori ................... B60L 11/1809 320/162 |

FOREIGN PATENT DOCUMENTS

| DE | 10126891 | 12/2002 |
| DE | 102010027711 | 1/2012 |
| DE | 102012204957 | 10/2013 |
| JP | 2010169609 | 8/2010 |

\* cited by examiner

*Primary Examiner* — John Breene
*Assistant Examiner* — Mohammad Islam
(74) *Attorney, Agent, or Firm* — Michael Best & Friedrich LLP

(57) ABSTRACT

A method for determining a constant current limit value by means of which a first current which flows through a battery cell is limited, wherein the constant current limit value is determined on the basis of a first function which specifies a first profile of the first current, which first profile is dependent on a plurality of parameters. The plurality of parameters include a first voltage which is applied between two terminals of the battery cell, a second voltage which specifies a no-load voltage of the battery cell, and a time variable.

8 Claims, 2 Drawing Sheets

METHOD AND APPARATUS FOR DETERMINING A CONSTANT CURRENT LIMIT VALUE

BACKGROUND OF THE INVENTION

The present invention relates to a method and an apparatus for determining a constant current limit value by means of which a first current which flows through a battery cell is limited.

It is known from the prior art that battery cells have to be protected against excessively high and excessively low voltage levels since otherwise the service life of the said battery cells is shortened and the battery cells may, under certain circumstances, be irreversibly damaged. Constant current limit values for a first current which flows through a battery cell of this kind are determined for this reason. The said constant current limit values ensure that, when they are complied with, a voltage value of a first voltage remains between suitable voltage limit values. When the first current is flowing, the first voltage is applied between two terminals of the battery cell with which contact can be made from outside the battery cell. The constant current limit values are each determined by means of a first function which specifies a first profile of the first current which flows through the battery cell, the said first profile being calculated depending on a plurality of parameters by means of a calculation model. In this case, the calculation model is dependent on a predefined equivalent circuit which is used for the battery cell. The plurality of parameters include the first voltage, a second voltage which specifies a no-load voltage of the battery cell, a time variable and further parameters. The time variable specifies a variable prediction period which is also called a variable prediction horizon. In order to determine a constant current limit value, an appropriate voltage limit value for the first voltage and a predefined time value for the time variable are used in the first function. In this case, the predefined value of the time variable, also called the "prediction time", specifies a duration of a maximum prediction period for which the determined constant current limit value is valid and at the end of which the first voltage reaches the corresponding voltage limit value when the first current is limited by means of the determined constant current limit value. The further parameters are dependent on a structure of the predefined equivalent circuit. The constant current limit values specify a maximum available constant current in the discharge direction during the maximum prediction period, and a maximum available constant current in the charging direction during the maximum prediction period. Determining a constant current limit value in this way is also known from document DE 10 2012 204 957 A1.

Document JP 2010-169609 A discloses a battery comprising a first determination unit and a second determination unit. The first determination unit is designed to determine a plurality of parameters of a predefined equivalent circuit which is used for the battery. In this case, the plurality of parameters are determined on the basis of measured voltage values of a battery voltage which is applied between two terminals of the battery and on the basis of measured current values of a battery current which flows through the battery. The plurality of parameters specify resistance and capacitance values of resistors and capacitors which are found in the predefined equivalent circuit. Furthermore, the first determination unit is designed to carry out correction of a parameter from amongst the plurality of parameters on the basis of a deviation. In this case, the deviation specifies a difference between an actually measured voltage value of the battery voltage and a voltage value of the battery voltage which is calculated by means of a calculation model which is dependent on the parameters. The second determination unit is designed to determine a constant current limit value for the battery current depending on the plurality of parameters.

SUMMARY OF THE INVENTION

The invention provides a method for determining a constant current limit value by means of which a first current which flows through a battery cell is limited. The constant current limit value is determined on the basis of a first function which specifies a first profile of the first current, which first profile is calculated depending on a plurality of parameters. The plurality of parameters include a first voltage which is applied between two terminals of the battery cell, a second voltage which specifies a no-load voltage of the battery cell, and a time variable which specifies a variable prediction period. A first, second and third step are carried out in the method according to the invention. The first step comprises measuring a current value of the first current and a voltage value of the first voltage. The second step comprises determining an actual correction voltage value depending on the measured current value of the first current and on the measured voltage value of the first voltage. The third step comprises determining the actual constant current limit value by means of a predefined function which is given by replacing the second voltage with a correction voltage, which is dependent on the second voltage and the actual correction voltage value, in the first function.

In the method according to the invention, the first voltage is applied between the two battery cell terminals of the battery cell when the first current is flowing.

In the method according to the invention, contact can preferably be made with the two battery cell terminals from outside the battery cell.

In the method according to the invention, the first profile of the first current is calculated by means of a calculation model.

In the method according to the invention, a predefined equivalent circuit is preferably used for the battery cell. When the predefined equivalent circuit is used, the calculation model is dependent on the predefined equivalent circuit.

A fourth step is preferably carried out in a method as described above. The fourth step comprises determining the correction voltage, which occurs in the predefined function, as a linear combination between the second voltage and the actual correction voltage value. This linear combination can preferably be defined as the sum between the second voltage and the actual correction voltage value.

In a method as described above, the constant current limit value is determined by means of the predefined function. In this case, the predefined function is determined depending on the actual correction voltage value. This is done in a simple manner by explicitly taking into account the actual correction voltage value in the first function. It should be taken into consideration here that the actual correction voltage value is determined depending on the measured values of the first current and the first voltage, that is to say depending on actually occurring values of the first current and the first voltage. Therefore, determination of the constant current limit value is not only based on the calculation model which is used for the first profile of the first current, but also on the actually occurring values of the first current and the first voltage. This increases the accuracy of determination of the actual constant current limit value.

A fifth step is preferably carried out in a method as described above. The fifth step comprises determining the constant current limit value as a constant current limit value function which corresponds to the predefined function when the first voltage has a predefined voltage value and the time variable has a predefined value. In this case, the predefined voltage value of the first voltage is equal to a voltage limit value. Furthermore, the predefined value of the time variable is equal to a prediction time which specifies a duration of a maximum prediction period for which the constant current limit value is valid.

In a method as described above, the parameters also include further parameters. When the predefined equivalent circuit is used, the further parameters are dependent on a structure of the said predefined equivalent circuit.

A sixth step is preferably carried out in a method as described above in which the parameters include the further parameters. The sixth step comprises defining the constant current limit value function in accordance with an equation which is specified in the text which follows. In this equation, GIB indicates the constant current limit value function, GUB1 indicates the predefined voltage value of the first voltage, UB2 indicates the second voltage, and KUB22 indicates the actual correction voltage value. Furthermore, i indicates a natural number, TP indicates the predefined value of the time variable, and U0i, R0, Ri and τi indicate the further parameters. In this case, the natural number i lies between 1 and a natural number n. The said equation reads as follows:

$$GIB = \frac{GUB1 - UB2 - KUB22 - \sum_{i=1}^{i=n} U0i \cdot (e^{-\frac{TP}{\tau i}})}{R0 + \sum_{i=1}^{i=n} Ri \cdot (1 - e^{-\frac{TP}{\tau i}})}$$

In a method as described above, a degree of accuracy with which the actual constant current limit value is determined is dependent on a degree of accuracy with which the second voltage can be estimated. Furthermore, the degree of accuracy with which the actual constant current limit value is determined is dependent on a degree of accuracy of the calculation model which is used for calculating the first profile of the first current. In this case, the degree of accuracy of the calculation model which is used for calculating the first profile of the first current is dependent, in particular, on a degree of accuracy with which the further parameters can be estimated. It should be taken into consideration here that the second voltage which is applied between the two electrodes of the battery cell can be estimated only inaccurately and changes over the life of the battery cell. It should further be taken into consideration that the actual correction voltage value can be accurately determined. One reason for this is that the actual correction voltage value is dependent on the actually occurring values of the first voltage and the first current which are measured and as a result also accurately determined. Therefore, an inaccuracy with which the second voltage can be estimated and an inaccuracy in the calculation model are compensated for by the actual correction voltage value.

A seventh, eighth, ninth, tenth, eleventh and twelfth step are preferably carried out in a method as described above. The seventh step comprises calculating a current value of the first current on the basis of the measured voltage value of the first voltage and a resistance value of an internal resistor of the battery cell. The eighth step comprises determining a preliminary correction voltage value on the basis of the measured current value and the calculated current value of the first current. The ninth step comprises using a second function which is given by replacing the second voltage with a correction voltage, which is dependent on the second voltage and the preliminary correction voltage value, in the first function. The tenth step comprises calculating an actual function value of the second function. The eleventh step comprises changing the preliminary correction voltage until the actual function value of the second function corresponds to the actual current value of the first current. The twelfth step comprises setting the actual correction voltage value equal to the changed preliminary correction voltage value.

A thirteenth step is preferably carried out in a method as described above. The thirteenth step comprises determining the correction voltage, which occurs in the second function, as a linear combination between the second voltage and the preliminary correction voltage value. This linear combination can preferably be defined as the sum between the second voltage and the preliminary correction voltage value.

In a method as described above which comprises the eleventh step, the actual correction voltage value is determined in a very simple manner by changing the preliminary correction voltage. Both the degree of inaccuracy with which the second voltage can be estimated and also the degree of inaccuracy of the calculation model can be particularly effectively compensated for by the actual correction voltage value which is determined in the said manner.

One advantage of a method as described above is that the constant current limit value can also be used when determining a power limit value by means of which an electrical power of the battery cell can be limited.

A further aspect of the invention relates to an apparatus for limiting a first current, which flows through a battery cell, by means of a constant current limit value. In this case, the apparatus comprises a voltage measurement unit, a current measurement unit and a determination unit. Furthermore, the voltage measurement unit is designed to measure a voltage value of a first voltage which is applied between two terminals of a battery cell and to supply the said voltage value to the determination unit. The current measurement unit is also designed to measure a current value of the first current and to supply the said current value to the determination unit. Furthermore, the determination unit is designed to determine the constant current limit value in accordance with a method as described above.

Reference is hereby explicitly made to the disclosure of document DE 10 2012 204 957 A1 as the basis for understanding the present invention.

BRIEF DESCRIPTION OF THE DRAWINGS

An exemplary embodiment of the invention will be described in detail below with reference to the accompanying drawings. The same reference symbols will be used for identical components and parameters. Each component and each parameter are introduced once and treated as already being known if repeated, irrespective of the drawing to which a respectively corresponding part of the description in which the component in question or the parameter in question is repeated relates. In the drawings.

DETAILED DESCRIPTION

Figure 1:
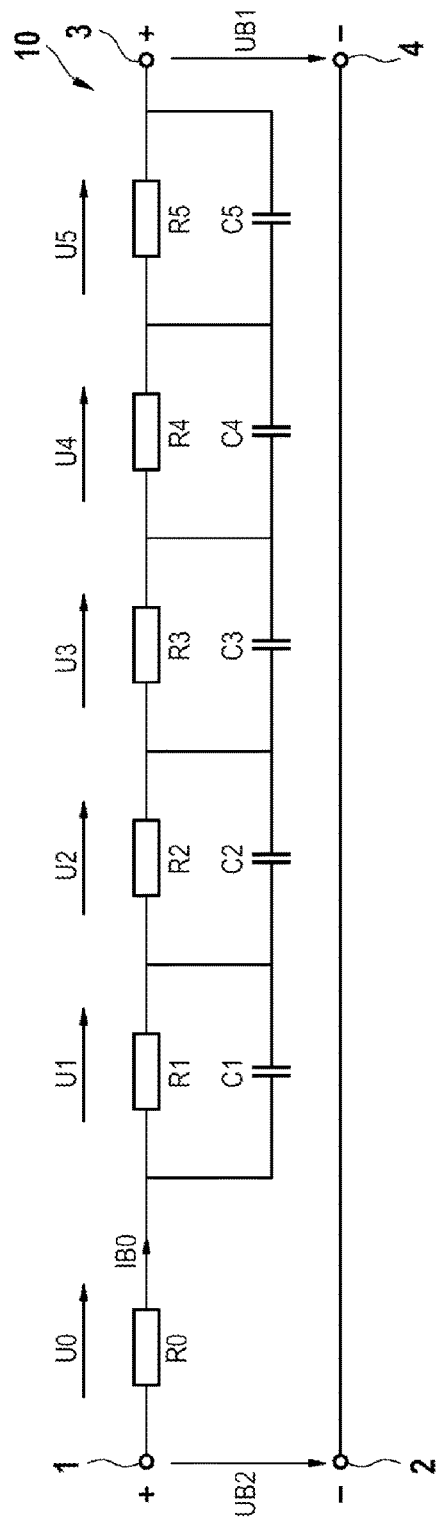
FIG. 1 shows a predefined equivalent circuit of a battery cell which is used when determining a constant current limit value by means of which a first current, which flows through the battery cell, is limited, as is to be carried out in accordance with a first embodiment of the invention.

FIG. 1 shows a predefined equivalent circuit 10 of a battery cell in which a positive battery cell pole 1 and a negative battery cell pole 2 of the battery cell are illustrated, the said battery cell poles being connected to two electrodes of the battery cell 10. A positive terminal 3 and a negative terminal 4 of the battery cell are also illustrated in the equivalent circuit 10. The equivalent circuit 10 comprises a first series circuit which is connected between the positive battery cell pole 1 and the positive terminal 3. The negative battery cell pole 2 is connected to the negative terminal 4 by means of a line.

The first series circuit comprises a predefined resistor and a second series circuit which are connected in series. The predefined resistor has a resistance value R0.

The second series circuit comprises, for example, five parallel circuits which have a first, second, third, fourth and fifth parallel circuit which are connected to one another in series. The first parallel circuit comprises a first resistor and a first capacitor which are connected in parallel. The first resistor has a resistance value R1. The first capacitor has a capacitor value C1. The second parallel circuit comprises a second resistor and a second capacitor which are connected in parallel. The second resistor has a resistance value R2. The second capacitor has a capacitor value C2. The third parallel circuit comprises a third resistor and a third capacitor which are connected in parallel. The third resistor has a resistance value R3. The third capacitor has a capacitor value C3. The fourth parallel circuit comprises a fourth resistor and a fourth capacitor which are connected in parallel. The fourth resistor has a resistance value R4. The fourth capacitor has a capacitor value C4. The fifth parallel circuit comprises a fifth resistor and a fifth capacitor which are connected in parallel. The fifth resistor has a resistance value R5. The fifth capacitor has a capacitor value C5. The second series circuit can comprise any desired number of parallel circuits which are each formed and connected to one another in series in the same way as each of the five parallel circuits mentioned above.

In FIG. 1, IB0 indicates a first current which flows through the predefined resistor and therefore also across the battery cell and the two battery cell terminals 3, 4.

Furthermore, UB1 indicates a first voltage which is applied between the two battery cell terminals 3, 4 when the first current is flowing. In addition, UB2 indicates a second voltage which specifies a no-load voltage UB2 of the battery cell and is applied between the two battery cell poles 1, 2 and therefore also between the two electrodes in the predefined equivalent circuit 10. Furthermore, U0 indicates a voltage which is dropped across the predefined resistor. In addition, U1 indicates a voltage which is dropped across the first resistor, U2 indicates a voltage which is dropped across the second resistor, U3 indicates a voltage which is dropped across the third resistor, U4 indicates a voltage which is dropped across the fourth resistor, and U5 indicates a voltage which is dropped across the fifth resistor.

Calculation of the first current IB0 which is carried out by means of a calculation model will be described in greater detail below in conjunction with FIG. 1. In this case, a first function IB1, which specifies a first profile, which is to be calculated, of the first current IB0 from a plurality of parameters, is initially used for the first current IB0. The abovementioned calculation model is dependent on the predefined equivalent circuit 10.

A relationship between the first voltage UB1, the second voltage UB2 and the voltages U0, U1, U2, U3, U4, U5 which are dropped across the resistors of the first series circuit is specified in a first equation (1) which is introduced below:

$$UB1 = UB2 + U0 + U1 + U2 + U3 + U4 + U5 \tag{1}$$

A relationship between the voltage U0 which is dropped across the predefined resistor, the first function IB1 which is used for the first current IB0, and the resistance value R0 of the predefined resistor is specified in a second equation (2) which is introduced below:

$$U0 = IB1 \cdot R0 \tag{2}$$

A relationship between each voltage Ui which is dropped across a resistor of the second series circuit, the first function IB1 which is used for the first current IB0, a time variable t, and further parameters relating to the respective resistor is specified in a third equation (3) which is introduced below:

$$Ui = U0i \cdot (e^{-\frac{t}{Ti}}) + IB1 \cdot Ri \cdot (1 - e^{-\frac{t}{Ti}}) \tag{3}$$

In the third equation (3), i indicates a natural number which lies between 1 and 5 and can relate to each resistor of the second series circuit. In this case, the time variable t specifies a variable prediction period which is also called a variable prediction horizon. The further parameters relating to each resistor of the second series circuit include the resistance value Ri of the respective resistor and a further voltage U0i which is dropped at the beginning of the variable prediction period t. The further parameters relating to each resistor of the second series circuit further comprise a time constant Ti which is calculated as a product between the resistance value Ri of the respective resistor and the capacitance value Ci of the capacitor which is connected in parallel with the respective resistor.

The first function IB1 which is used for the first current IB0 is specified depending on the plurality of parameters, which include the first voltage UB1, the second voltage UB2, the time variable t and the above-defined further parameters relating to each resistor of the second series circuit, in a fourth equation (4) which is introduced below:

$$IB1 = \frac{UB1 - UB2 - \sum_{i=1}^{i=5} U0i \cdot (e^{-\frac{t}{Ti}})}{R0 + \sum_{i=1}^{i=5} Ri \cdot (1 - e^{-\frac{t}{Ti}})} \tag{4}$$

Parameters which include the resistance value R0 of the predefined resistor and the above-defined further parameters relating to each resistor of the second series circuit are simply called further parameters.

The fourth equation (4) shows how the first profile of the first current IB0 can be calculated by means of the first function IB1 depending on the plurality of parameters.

A relationship between a resistance value RB of an internal resistor of the battery cell, the resistance value R0 of the predefined resistor and the resistance value Ri of each resistor of the second series circuit is specified in a fifth equation (5) which is introduced below:

$$RB = R0 + \sum_{i=1}^{i=5} Ri \qquad (5)$$

Figure 2:
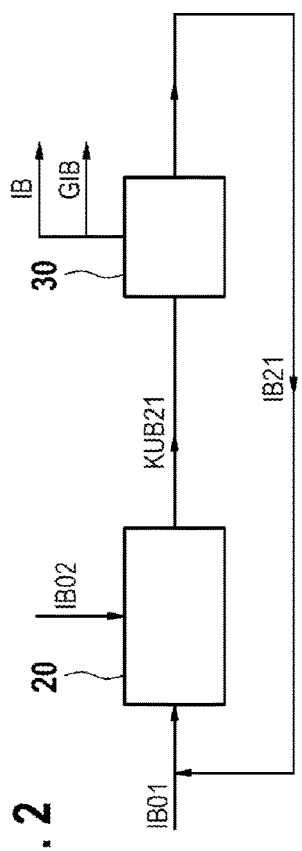
FIG. 2 shows a highly schematic illustration of a controller and a calculation unit which are used when determining the constant current limit value as is to be carried out in accordance with the first embodiment of the invention.

FIG. 2 shows a highly schematic illustration of a controller 20 and a calculation unit 30 which are used when determining a constant current limit value GIB as is to be carried out in accordance with a first embodiment of the invention. In this case, the first current IB0 is limited by means of the constant current limit value GIB. The said determination process is explained in greater detail in connection with FIGS. 1 and 2.

According to the first embodiment of the invention, a voltage value of the first voltage UB1 and a current value IB01 of the first current IB0 are measured. In this case, the measured current value IB01 of the first current IB0 is supplied to the controller 20. Furthermore, a current value IB02 of the first current IB0 is calculated on the basis of the measured voltage value of the first voltage UB1 and the resistance value RB of the internal resistor of the battery cell and supplied to the controller 20. The controller 20 determines a preliminary correction voltage value KUB21 on the basis of the measured current value IB01 and the calculated current value IB02 of the first current IB0. Furthermore, the controller 20 supplies the preliminary correction voltage value KUB21 to the calculation unit 30. The calculation unit 30 uses a second function IB2 which is given by replacing the second voltage UB2 with a correction voltage, which is dependent on the second voltage UB2 and the preliminary correction voltage value KUB21, in the first function IB1.

A relationship between the second function IB2, the plurality of parameters, and the preliminary correction voltage value KUB21 is specified in a sixth equation (6) which is introduced below:

$$IB2 = \frac{UB1 - UB2 - KUB21 - \sum_{i=1}^{i=5} U0i \cdot (e^{-\frac{t}{\tau i}})}{R0 + \sum_{i=1}^{i=5} Ri \cdot (1 - e^{-\frac{t}{\tau i}})} \qquad (6)$$

The calculation unit 30 further calculates an actual function value IB21 of the second function IB2 which is valid for an actual sampling instant. In this case, a function value of the second function IB2 is recalculated, that is to say updated, after each sampling instant. A time interval between two immediately successive sampling instants is called sampling time T1. A first value T1 of the time variable t, which first value is used when calculating the actual function value IB21 of the second function IB2 in the second function IB2, corresponds to the sampling time T1 which can be, for example, 0.1 s. When calculating the actual function value IB21 of the second function IB2, the actual parameter values thereof are used for all other parameters of the plurality of parameters in the second function IB2.

A relationship between the actual function value IB21 of the second function IB2, the plurality of parameters and the preliminary correction voltage value KUB21 is specified in a seventh equation (7) which is introduced below, where the time variable t has the first value T1:

$$IB21 = \frac{UB1 - UB2 - KUB21 - \sum_{i=1}^{i=5} U0i \cdot (e^{-\frac{T1}{\tau i}})}{R0 + \sum_{i=1}^{i=5} Ri \cdot (1 - e^{-\frac{T1}{\tau i}})} \qquad (7)$$

The calculation unit 30 further provides the actual function value IB21 of the second function IB2 to the controller 20. The controller 20 compares the measured current value IB01 of the first current IB0 with the actual function value IB21 of the second function IB2. Furthermore, the controller 20 changes the preliminary correction voltage value KUB21 possibly until the actual function value IB21 of the second function IB2 is equal to the measured current value IB01 of the first current IB0. The calculation unit 30 uses that value of the correction voltage value KUB21 for which the actual function value IB21 of the second function IB2 is equal to the measured current value IB01 of the first current IB0 as an actual correction voltage value KUB22.

The calculation unit 30 further uses a predefined function IB, which is given by replacing the second voltage UB2 with a correction voltage, which is dependent on the second voltage UB2 and the actual correction voltage value KUB22, in the first function IB1.

A relationship between the predefined function IB, the plurality of parameters, and the actual correction voltage value KUB22 is specified in an eighth equation (8) which is introduced below:

$$IB = \frac{UB1 - UB2 - KUB22 - \sum_{i=1}^{i=5} U0i \cdot (e^{-\frac{t}{\tau i}})}{R0 + \sum_{i=1}^{i=5} Ri \cdot (1 - e^{-\frac{t}{\tau i}})} \qquad (8)$$

According to the first embodiment, the calculation unit 30 determines the constant current limit value GIB, by means of which the first current IB0 is limited, as a constant current limit value function GIB. In this case, the constant current limit value function GIB corresponds to the predefined function IB when the first voltage UB1 has a predefined voltage value GUB1 and the time variable t has a predefined value TP which is greater than the first value T1 of the time variable t. In this case, the predefined voltage value GUB1 of the first voltage UB1 corresponds to a predefined voltage limit value GUB1. Furthermore, the predefined value TP of the time variable corresponds to a prediction time TP which specifies a duration of a maximum prediction period for which the constant current limit value GIB is valid. The prediction time TP can be an integer multiple of the sampling time, but usually has values of between 1 s and 180 s.

A relationship between the constant current limit value GIB, the plurality of parameters, and the actual correction voltage value KUB22 is specified in a ninth equation (9) which is introduced below, where the first voltage UB1 has the predefined voltage value GUB1 and the time variable t has the predefined value TP:

$$GIB = \frac{GUB1 - UB2 - KUB22 - \sum_{i=1}^{i=5} U0i \cdot (e^{-\frac{TP}{\tau i}})}{R0 + \sum_{i=1}^{i=5} Ri \cdot (1 - e^{-\frac{TP}{\tau i}})} \quad (9)$$

In this case, the constant current limit value GIB is recalculated, that is to say updated, after each sampling instant. The time interval between two immediately successive sampling instants corresponds to the abovementioned sampling time T1.

In the first embodiment of the invention, the voltage limit value GUB1 can specify both a minimum voltage limit value in the discharging direction and also a maximum voltage limit value in the charging direction. Therefore, the calculated constant current limit value GIB can also specify both a constant current limit value in the discharging direction and also a constant current limit value in the charging direction. These constant current limit values GIB ensure that, when they are complied with, a voltage value of the first voltage UB1 remains between the corresponding voltage limit values GUB1.

Figure 3:
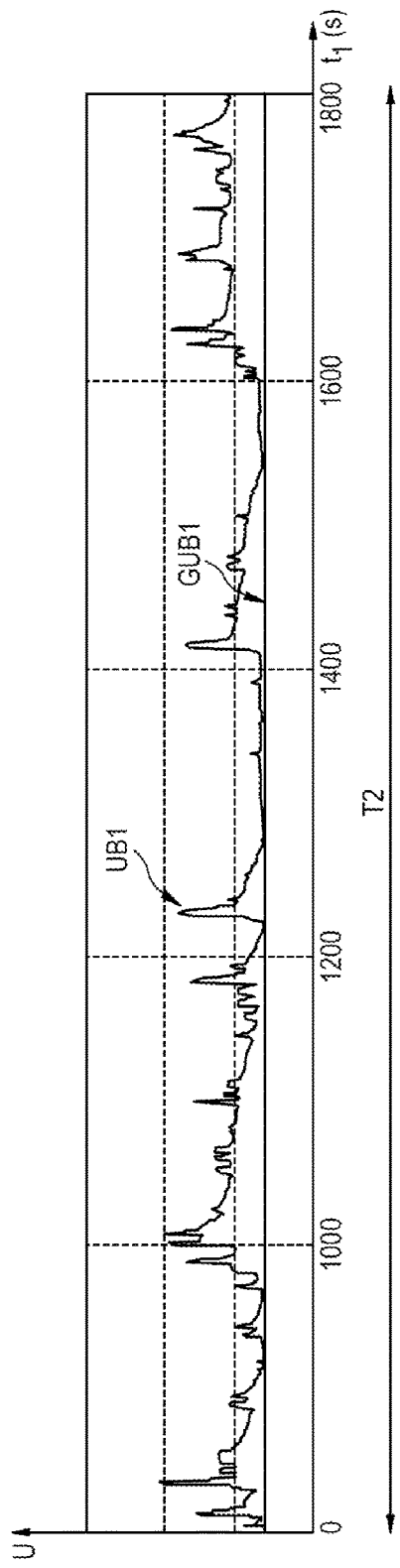
FIG. 3 shows a profile, illustrated as a function of time, of a first voltage which is applied between two terminals of the battery cell when the first current is flowing in comparison to a voltage limit value.

FIG. 3 shows a profile of the first voltage UB1 as a function of a time t1 which is measured in seconds. In this case, T2 in FIG. 3 indicates a predefined period over which the first current IB0 flows through the battery cell. The first current IB0 is limited by means of the constant current limit value GIB, which is determined depending on the voltage limit value GUB1, over the predefined period T2. FIG. 3 also illustrates the voltage limit value GUB1. Here, the voltage limit value GUB1 specifies the minimum voltage limit value. It is clear from FIG. 3 that a voltage value of the first voltage UB1 never falls below the voltage limit value GUB1. An axis which specifies voltage values which can be assumed by the first voltage UB1 is indicated by U in FIG. 1.

In addition to the above written disclosure, reference is hereby additionally made to the illustration in FIGS. 1 to 3 for further disclosure of the invention.

The invention claimed is:

1. A method for determining a constant current limit value (GIB) by means of which a first current (IB0) which flows through a battery cell is limited, wherein the constant current limit value (GIB) is determined on the basis of a first function which specifies a first profile of the first current (IB0), which first profile is calculated depending on a plurality of parameters, wherein the plurality of parameters include a first voltage (UB1) which is applied between two terminals (3, 4) of the battery cell, a second voltage (UB2) which specifies a no-load voltage (UB2) of the battery cell, and a time variable which specifies a variable prediction period, the method comprising:
measuring, with a current sensor, a current value (IB01) of the first current (IB0),
measuring, with a voltage sensor, a voltage value of the first voltage (UB1),
determining, with a controller that receives the current value (IB01) from the sensor, an actual correction voltage value depending on the measured current value (IB01) of the first current (IB0) and on the measured voltage value of the first voltage (UB1),
determining, with the controller, the constant current limit value (GIB) by means of a predefined function (IB) which is given by replacing the second voltage (UB2) with a correction voltage, which is dependent on the second voltage (UB2) and the actual correction voltage value, in the first function,
limiting, by the controller, the first current (IB0) according to the constant current limit value (GIB)
determining a changed preliminary correction voltage value (KUB21), and
setting, with the controller, the actual correction voltage value equal to the changed preliminary correction voltage value (KUB21).

2. The method according to claim 1, further comprising:
determining, with the controller, the correction voltage, which occurs in the predefined function (IB), as a linear combination between the second voltage (UB2) and the actual correction voltage value.

3. The method according to claim 1, further comprising:
determining, with the controller, the constant current limit value (GIB) as a constant current limit value function (GIB) which corresponds to the predefined function (TB) when the first voltage (UB1) has a predefined voltage value (GUB1) and the time variable has a predefined value, wherein the predefined value of the time variable specifies a duration of a maximum prediction period for which the constant current limit value is valid.

4. The method according to claim 1, wherein the parameters also include further parameters.

5. The method according to claim 4, wherein:
defining the constant current limit value function (GIB) in accordance with a first equation which is specified below and in which GIB indicates the constant current limit value function (GIB), GUB1 indicates the predefined voltage value (GUB1) of the first voltage (UB1), UB2 indicates the second voltage (UB2), KUB22 indicates the actual correction voltage value, i indicates a natural number which lies between 1 and a natural number n, TP indicates the predefined value of the time variable, and U0i, R0, Ri and τi indicate the further parameters:

$$GIB = \frac{GUB1 - UB2 - KUB22 - \sum_{i=1}^{i=n} U0i \cdot (e^{-\frac{TP}{\tau i}})}{R0 + \sum_{i=1}^{i=n} Ri \cdot (1 - e^{-\frac{TP}{\tau i}})}.$$

6. The method according to claim 1, wherein determining the changed preliminary correction includes:
calculating, with the controller, a current value (IB02) of the first current (IB0) on the basis of the measured voltage value of the first voltage (UB1) and a resistance value of the internal resistor of the battery cell,
calculating, with the controller, an actual function value (IB21) of the second function, and
changing, with the controller, the preliminary correction voltage (KUB21) until the actual function value (IB21) of the second function corresponds to the measured current value (IB01) of the first current (IB0).

7. The method according to claim 6, further comprising:
determining, with the controller, the correction voltage, which occurs in the second function, as a linear combination between the second voltage (UB2) and the preliminary correction voltage value (KUB21).

8. An apparatus for determining a constant current limit value (GIB) by means of which a first current (IB0) which flows through a battery cell is limited, wherein the apparatus comprises a voltage sensor, a current sensor and a controller, wherein the voltage sensor is designed to measure a voltage value of a first voltage (UB1) which is applied between two terminals (3, 4) of a battery cell and to supply the said voltage value to the determination unit, the current sensor is designed to measure a current value (IB01) of the first current (IB0) and to supply the said current value to the controller, the controller designed to measure, via the current sensor, a current value (IB01) of the first current (IB0), measure, via the voltage sensor, a voltage value of the first voltage (UB1), determine an actual correction voltage value depending on the measured current value (IB01) of the first current (IB0) and on the measured voltage value of the first voltage (UB1), determine the constant current limit value (GIB) by means of a predefined function (IB) which is given by replacing the second voltage (UB2) with a correction voltage, which is dependent on the second voltage (UB2) and the actual correction voltage value, in the first function, limit, the first current according to the constant current limit value, determining a changed preliminary correction voltage value (KUB21), and setting, with the controller, an actual correction voltage value equal to the changed preliminary correction voltage value (KUB21).

\* \* \* \* \*